(12) United States Patent
Chen et al.

(10) Patent No.: US 10,462,433 B2
(45) Date of Patent: Oct. 29, 2019

(54) IMAGE SENSOR WITH BIG AND SMALL PIXELS AND METHOD OF MANUFACTURE

(71) Applicant: OmniVision Technologies, Inc., Santa Clara, CA (US)

(72) Inventors: Gang Chen, San Jose, CA (US); Duli Mao, Sunnyvale, CA (US); Dyson Hsin-Chih Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/967,678

(22) Filed: May 1, 2018

(65) Prior Publication Data

US 2018/0249136 A1    Aug. 30, 2018

Related U.S. Application Data

(62) Division of application No. 15/197,464, filed on Jun. 29, 2016, now Pat. No. 9,986,213.

(51) Int. Cl.
| | |
|---|---|
| *H04N 9/083* | (2006.01) |
| *H04N 5/355* | (2011.01) |
| *H04N 5/225* | (2006.01) |
| *H01L 27/146* | (2006.01) |
| *H04N 5/369* | (2011.01) |
| *H04N 9/04* | (2006.01) |

(52) U.S. Cl.
CPC ......... *H04N 9/083* (2013.01); *H01L 27/1462* (2013.01); *H01L 27/14605* (2013.01); *H01L 27/14621* (2013.01); *H01L 27/14627* (2013.01); *H01L 27/14645* (2013.01); *H04N 5/2252* (2013.01); *H04N 5/2253* (2013.01); *H04N 5/2257* (2013.01); *H04N 5/35563* (2013.01); *H04N 5/3696* (2013.01); *H04N 9/045* (2013.01)

(58) Field of Classification Search
CPC ........ H01L 27/14621; H01L 27/14627; H04N 9/083; H04N 5/3696; H04N 5/2253
See application file for complete search history.

(56) References Cited

U.S. PATENT DOCUMENTS

2010/0315536 A1* 12/2010 Wang ....................... G06K 7/14
348/239

* cited by examiner

*Primary Examiner* — Christopher K Peterson
(74) *Attorney, Agent, or Firm* — Larry E. Henneman, Jr.; Henneman & Associates, PLC

(57) ABSTRACT

An image sensor includes a substrate, a first set of sensor pixels formed on the substrate, and a second set of sensor pixels formed on the substrate. The sensor pixels of the first set are arranged in rows and columns and are configured to detect light within a first range of wavelengths (e.g., white light). The sensor pixels of the second set are arranged in rows and columns and are each configured to detect light within one of a set of ranges of wavelengths (e.g., red, green, and blue). Each range of wavelengths of the set of ranges of wavelengths is a subrange of said first range of wavelengths, and each pixel of the second set of pixels is smaller than each pixel of the first set of pixels.

19 Claims, 7 Drawing Sheets

IMAGE SENSOR WITH BIG AND SMALL PIXELS AND METHOD OF MANUFACTURE

CROSS-REFERENCE TO RELATED APPLICATIONS

This application is a divisional of co-pending U.S. patent application Ser. No. 15/197,464, filed on Jun. 29, 2016 by the same inventors, which is incorporated herein by reference in its entirety.

BACKGROUND OF THE INVENTION

Field of the Invention

This invention relates generally to digital imaging, and more particularly to high dynamic range (HDR) pixel arrays.

Description of the Background Art

Color sensitive digital imagers are well known. Typically color imagers are comprised of a plurality of image sensor pixels, each being sensitive to light of one of three different colors. The pixels are typically laid out in rows and columns, wherein each square of four pixels includes one pixel sensitive to two of the three colors and two pixels sensitive to the third color. Through this arrangement, color images are created by interpolating missing color information from neighboring pixels of that color. Color images created in this way have deficiencies in quality, which result from filtering out a large portion of the incident light and filling in missing color information, such as poor light sensitivity and low resolution.

One solution for increasing the quality of color images is the utilization of a big-small pixel scheme for laying out pixels on an imager sensor. In the big-small pixel scheme, some of the pixels are larger than others. In prior art systems, both big and small pixels are sensitive to one of three colors (e.g., R, G, B). The big pixels are more sensitive to lower light intensities than the small pixels. The big-small scheme facilitates the capture of images with a higher dynamic range (HDR) and provides more detail in images with widely varying local light intensities. In areas of the image with high light intensity, the small pixels will be sampled, because they are less sensitive to the light and will, therefore, be less likely to have become saturated. In areas of the image with lower light intensity, the big pixels will be sampled, because they are more sensitive to the light. The resultant image has a higher dynamic range, and shows more detail in both high and low light areas. However, big-small schemes are not preferable for low light applications, because a significant portion of the impinging light is filtered out by the color filters which pass only a small spectral band compared to the entire visible spectrum.

Another solution for increasing the quality of color images is the utilization of polychromatic (i.e. white) image sensing pixels in addition to the color sensing pixels. These pixels are sensitive to light across most of the visible spectrum, increasing the light sensitivity of the white pixels as compared to the color filtered pixels. Several white/color pixel layouts have been utilized, including a big-small scheme, in which all the small pixels are polychromatic (e.g., white) and all the big pixels are color sensitive (e.g., R, G, B). This layout has been used, for example to reduce color aliasing in a recorded image. Another layout utilizes one each of the three color sensitive pixels and a polychromatic pixel arranged in a square, which is repeated. Yet another layout utilizes hexagonal pixels to create a layout with twice as many polychromatic light sensing pixels as color sensing pixels. Yet another layout utilizes a 4×4 square of image sensing pixels wherein the color pixels are arranged along a diagonal of the square (G-R-G-B) and the remaining pixels of the square are polychromatic. These layouts each improve image resolution and sensitivity, but there is still a desire for even better image quality.

Yet another solution for increasing the quality of color images is the fusion of a monochromatic and color version of the same image, taken with separate image sensors. The monochromatic image, because all the pixels are the same, has a resolution that is at least three times higher than the color image. Using the monochromatic image as the base, the two are used to generate a resulting color image that has a higher resolution and lower noise than a traditional color image. Drawbacks to this solution include the increased costs and complexity due to the utilization of two separate imagers. This solution also requires that the two images be realigned digitally, which requires increased processing power and sacrifices speed. Additionally, this solution sacrifices low light sensitivity, because the two sensors have pixels of the same size.

What is needed, therefore, is a single color imager that produces images with an even greater sensitivity, resolution, and/or dynamic range than the prior art.

SUMMARY

The present invention overcomes the problems associated with the prior art by providing an image sensor including arrays of large (black and white) and small (color) pixels. The invention facilitates better image resolution, higher sensitivity, and increased dynamic range.

An example image sensor includes a substrate, a first set of sensor pixels and a second set of sensor pixels formed on the substrate. Sensor pixels of the first set are arranged in rows and columns and are each configured to detect light within a first range of wavelengths. Sensor pixels of the second set are arranged in rows and columns and are each configured to detect light within one of a set of ranges of wavelengths. Each range of wavelengths of the set of ranges of wavelengths is a subrange of the first range of wavelengths. In addition, each pixel of the second set of pixels is smaller than each pixel of the first set of pixels, and each pixel of the first set of pixels has a center disposed between adjacent rows of the second set of pixels and between adjacent columns of the second set of pixels.

In the example embodiment, the set of ranges of wavelengths includes a second range of wavelengths, a third range of wavelengths, and a fourth range of wavelengths. In a particular embodiment, the second range of wavelengths corresponds to a red portion of the visible light spectrum, the third range of wavelengths corresponds to a green portion of the visible light spectrum, and the fourth range of wavelengths corresponds to a blue portion of the visible light spectrum. The second set of sensor pixels includes a first group of color pixels, a second group of color pixels, and a third group of color pixels. The first group of color pixels is configured to detect only light within the second range of wavelengths, and the first group makes up 25% of the second set of sensor pixels. The second group of color pixels is configured to detect only light within the third range of wavelengths, and the second group makes up 50% of the second set of sensor pixels. The third group of color pixels is configured to detect only light within the fourth range of wavelengths, and the third group makes up 25% of the second set of sensor pixels.

In an example image sensor, each pixel of the first set of sensor pixels includes a transparent window operative to pass all light within the first range of wavelengths. Each pixel of the first group of the second set of sensor pixels includes a light filter operative to pass light within the second range of wavelengths. Each pixel of the second group of the second set of sensor pixels includes a light filter operative to pass light within the third range of wavelengths, and each pixel of the third group of the second set of sensor pixels includes a light filter operative to pass light within the fourth range of wavelengths.

In an example pixel arrangement, one half of the rows of the second set of sensor pixels include pixels of the first group and pixels of the second group of the second set of sensor pixels arranged in an alternating pattern. The other half of the rows of the second set of sensor pixels include pixels from the second group and the third group of the second set of sensor pixels arranged in an alternating pattern. In addition, one half of the columns of the second set of sensor pixels include pixels from the first group and pixels from the second group of the second set of sensor pixels arranged in an alternating pattern. The other half of the columns of the second set of sensor pixels include pixels from the second group and pixels from the third group of the second set of sensor pixels arranged in an alternating pattern.

In an example embodiment, only one of the second set of sensor pixels is disposed between each group of 4 adjacent pixels of the first set of sensor pixels. In a more particular embodiment, each of the second set of sensor pixels is disposed between truncated corners of 4 adjacent pixels of the first set of sensor pixels. Each of the sensor pixels of the first set is substantially rectangular, with truncated corners, and each of the sensor pixels of the second set is substantially rectangular and oriented at an angle with respect to the pixel sensors of the first set. Side edges of the sensor pixels of the second set are substantially parallel to edges of the truncated corners of the sensor pixels of the first set.

In an example embodiment, each of the second set of sensor pixels is spaced apart from every other one of the second set of sensor pixels by a distance greater than a width of one of the second set of sensor pixels. The pitch between adjacent columns of the first set of sensor pixels is the same as a pitch between adjacent columns of the second set of sensor pixels, and the pitch between adjacent rows of the first set of sensor pixels is the same as a pitch between adjacent rows of the second set of sensor pixels. The first set of sensor pixels includes one fewer rows than the second set of sensor pixels, and the first set of sensor pixels includes one fewer columns than the second set of sensor pixels.

In an example embodiment, the substrate is a silicon substrate, and the image sensor includes a set of micro-lenses disposed above the first set of sensor pixels and the second set of sensor pixels and configured to increase the effective area of each pixel of the first set and the second set of sensor pixels.

An example filter array for an image sensor is also disclosed. The filter array includes a set of transparent windows and a set of filters. The transparent windows are disposed above the image sensor, arranged in rows and columns, and configured to pass light within a first range of wavelengths. The filters are disposed above the image sensor, arranged in rows and columns, and each configured to pass light within one of a set of ranges of wavelengths. Each range of wavelengths of the set of ranges of wavelengths is a subrange of the first range of wavelengths, and each filter of the set of filters is smaller than each transparent window of the set of transparent windows. Each transparent window of the set of transparent windows has a center disposed between adjacent rows of the filters and between adjacent columns of the filters.

The set of ranges of wavelengths includes a second range of wavelengths, a third range of wavelengths, and a fourth range of wavelengths. The second range of wavelengths corresponds to a red portion of the visible light spectrum, the third range of wavelengths corresponds to a green portion of the visible light spectrum, and the fourth range of wavelengths corresponds to a blue portion of the visible light spectrum.

In the example filter array, the set of filters includes a first group of color filters, a second group of color filters, and a third group of color filters. The filters of the first group of color filters are configured to pass only light within the second range, and make up 25% of the set of filters. The filters of the second group of color filters are configured to pass only light within the third range, make up 50% of the set of filters. The filters of the third group of color filters are configured to pass only light within the fourth range, and make up 25% of the set of filters.

In the example filter, one half of the rows of the set of filters include filters from the first group and filters from the second group of the set of filters arranged in an alternating pattern. The other half of the rows of the set of filters include filters from the second group and filters from the third group of the set of filters arranged in an alternating pattern. Similarly, one half of the columns of the set of filters include filters from the first group and filters from the second group of the set of filters arranged in an alternating pattern. The other half of the columns of the set of filters include filters from the second group and filters from the third group of the set of filters arranged in an alternating pattern.

In an example arrangement, only one filter of the set of filters is disposed between each group of 4 adjacent transparent windows of the set of transparent windows, and each filter is spaced apart from every other filter by a distance greater than a width of one of the filters. Each filter of the set of filters is disposed between truncated corners of 4 adjacent transparent windows of the set of transparent windows. Each of the transparent windows is substantially rectangular and has truncated corners. Each of the filters is substantially rectangular and oriented at an angle with respect to the transparent windows, such that side edges of the filters are substantially parallel to edges of the truncated corners of the transparent windows. The set of transparent windows includes one fewer rows than the set of filters, and the set of transparent windows includes one fewer columns than the set of filters. A pitch between adjacent columns of the set of transparent windows is the same as a pitch between adjacent columns of the set of filters, and a pitch between adjacent rows of the set of transparent windows is the same as a pitch between adjacent rows of the set of filters.

Optionally, the filter array includes a set of micro-lenses disposed above the set of transparent windows and above the set of filters. The micro lenses are configured to increase the effective area of the image sensor.

An example camera module is also disclosed. The example camera module includes a housing, a lens, and an image sensor. The housing defines an aperture, and the lens is disposed in the aperture. The image sensor is fixed within the housing and is disposed in a focal plane of the lens. The image sensor includes a plurality of image sensor pixels including a first set arranged in rows and columns and a second set arranged in rows and columns. Each pixel of the first set is configured to detect light of the entire visible spectrum, and each pixel of the second set is operative to detect light of one of three distinct colors. The pixels of the first set are larger than each pixel of the second set, and each pixel of the first set of pixels has a center disposed between adjacent rows of the second set of pixels and between adjacent columns of the second set of pixels.

An example method of manufacturing an image sensor is also disclosed. The example method includes providing a substrate, forming a first set of sensor pixels on the substrate arranged in rows and columns, and forming a second set of sensor pixels on the substrate arranged in rows and columns. Each pixel of the second set of pixels is smaller than each pixel of the first set of pixels.

The example method further includes forming a set of transparent windows over the first set of sensor pixels. The transparent windows are arranged in rows and columns and each window is configured to pass light within a first range of wavelengths. The example method further includes forming a set of filters over the second set of sensor pixels. The filters are arranged in rows and columns, and each filter configured to detect light within one of a set of ranges of wavelengths, each range of wavelengths of the set of ranges of wavelengths being a subrange of the first range of wavelengths. Each pixel of the first set of pixels has a center disposed between adjacent rows of the second set of pixels and between adjacent columns of the second set of pixels.

The set of ranges of wavelengths includes a second range of wavelengths, a third range of wavelengths, and a fourth range of wavelengths. The second range of wavelengths corresponds to a red portion of the visible light spectrum. The third range of wavelengths corresponds to a green portion of the visible light spectrum, and the fourth range of wavelengths corresponds to a blue portion of the visible light spectrum.

In an example method, the step of forming a set of filters over the second set of sensor pixels includes forming a first group of filters, forming a second group of filters, and forming a third group of filters. The first group of filters is configured to pass only light within the second range of wavelengths and makes up 25% of the second set of filters. The second group of filters is configured to pass only light within the third range of wavelengths and makes up 50% of the second set of filters. The third group of filters is configured to pass only light within the fourth range of wavelengths and makes up 25% of the second set of filters.

In a particular method, the step of forming a set of filters includes forming one half of the rows of the set of filters with filters of the first group and with filters of the second group arranged in an alternating pattern. The step of forming a set of filters further includes forming the other half of the rows of the set of filters with filters of the second group and with filters of the third group arranged in an alternating pattern. The step of forming a set of filters further includes forming one half of the columns of the set of filters with filters of the first group and with filters of the second group arranged in an alternating pattern, and forming the other half of the columns of the set of filters with filters of the second group and with filters of the third group arranged in an alternating pattern.

In an example method, the step of forming a second set of sensor pixels includes forming each pixel of the second set of sensor pixels between each group of 4 adjacent pixels of the first set of sensor pixels. In a more particular method, the step of forming a second set of sensor pixels includes forming each pixel of the second set of sensor pixels between truncated corners of 4 adjacent pixels of the first set of sensor pixels. In addition, the step of forming a set of filters includes forming each filter of the set of filters between each group of 4 adjacent transparent windows of the set of transparent windows. In the more particular method, the step of forming a set of filters includes forming each filter of the set of filters between truncated corners of 4 adjacent transparent windows of the set of transparent windows.

In an example method, the step of forming a second set of sensor pixels includes forming each pixel of the second set of sensor pixels spaced apart from every other pixel of the second set of sensor pixels by a distance greater than a width of one of the sensor pixels of the second set of sensor pixels. In addition, the step of forming a set of filters includes forming each filter of the set of filters spaced apart from every other filter of the set of filters by a distance greater than a width of one of the filters.

In an example method, the steps of forming a first set of sensor pixels and forming a second set of sensor pixels include forming one fewer rows of the sensor pixels of the second set than the sensor pixels of the first set, and forming one fewer columns of the sensor pixels of the second than the sensor pixels of the first set. The steps of forming a set of transparent windows and forming a set of filters include forming one fewer rows of the filters than the transparent windows, and forming one fewer columns of the filters than the transparent windows.

Optionally, the example method further includes forming a set of micro-lenses above the set of transparent windows and the set of filters. The set of micro-lenses is configured to increase the effective area of each pixel of the first set and the second set of sensor pixels.

In an example method, the step of forming a second set of sensor pixels includes forming the second set of sensor pixels with a pitch between adjacent rows of the second set of sensor pixels that is equal to a pitch between adjacent rows of the first set of sensor pixels. In addition, the step of forming a second set of sensor pixels includes forming the second set of sensor pixels with a pitch between adjacent columns of the second set of sensor pixels that is equal to a pitch between adjacent columns of the first set of sensor pixels. The step of forming a set of filters includes forming the set of filters with a pitch between adjacent rows of the set of filters that is equal to a pitch between adjacent rows of the set of transparent windows and forming the set of filters with a pitch between adjacent columns of the set of filters that is equal to a pitch between adjacent rows of the set of transparent windows.

BRIEF DESCRIPTION OF THE DRAWINGS

The present invention is described with reference to the following drawings, wherein like reference numbers denote substantially similar elements.

DETAILED DESCRIPTION

The present invention overcomes the problems associated with the prior art, by providing an image sensor that produces images with high resolution, high dynamic range, and good low light sensitivity. In the following description, numerous specific details are set forth (e.g., sensor pixel circuit design) in order to provide a thorough understanding of the invention. Those skilled in the art will recognize, however, that the invention may be practiced apart from these specific details. In other instances, details of well-known image sensor practices (e.g., image data processing, semiconductor fabrication, etc.) and components have been omitted, so as not to unnecessarily obscure the present invention.

Figure 1:
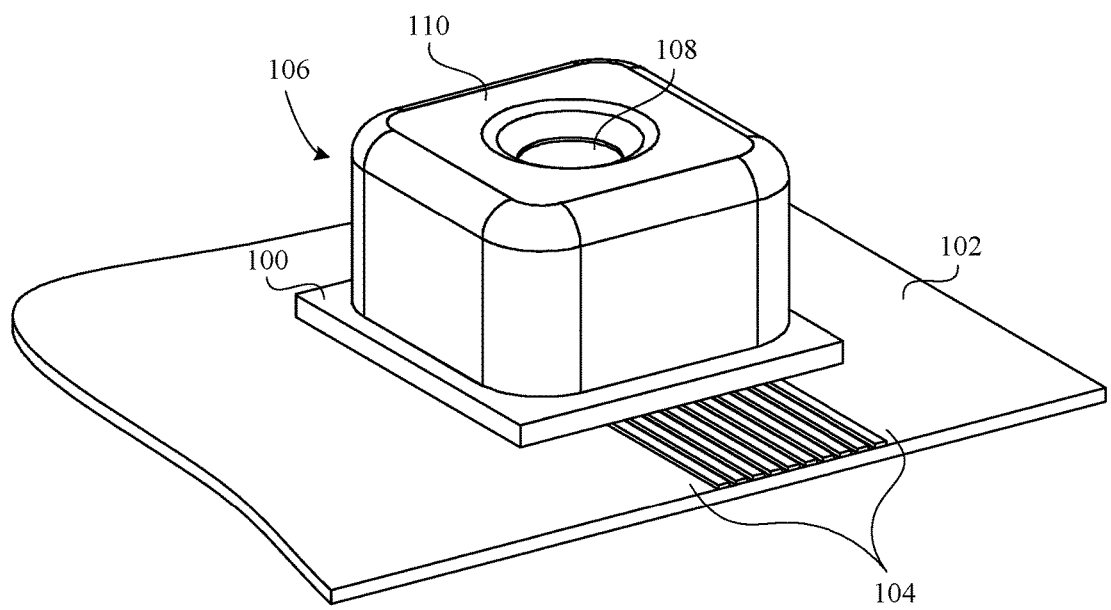
FIG. 1 is a perspective view of a camera module mounted on a circuit board of a host device.

FIG. 1 is a perspective view of an image sensor 100 mounted on a portion of a printed circuit board (PCB) 102 that represents a PCB of a camera host device (e.g., automobile, manufacturing machine, security camera, medical device, cell phone, etc.). Image sensor 100 communicates electronically with other components of the host device, via a plurality of conductive traces 104. In the example embodiment, image sensor 100 is depicted as being part of a camera module 106 that further includes an optical assembly 108 and a housing 110. As shown, housing 110 is mounted over image sensor 100, and optical assembly 108 is beneath an optical aperture formed in housing 110. Those skilled in the art will recognize that the particular designs and/or presence of PCB 102, traces 104, optical assembly 108, and housing 110 will depend on the particular application, and are not particularly germane to the present invention. Therefore, PCB 102, traces 104, optical assembly 108, and housing 110 are representational in character only.

Figure 2:
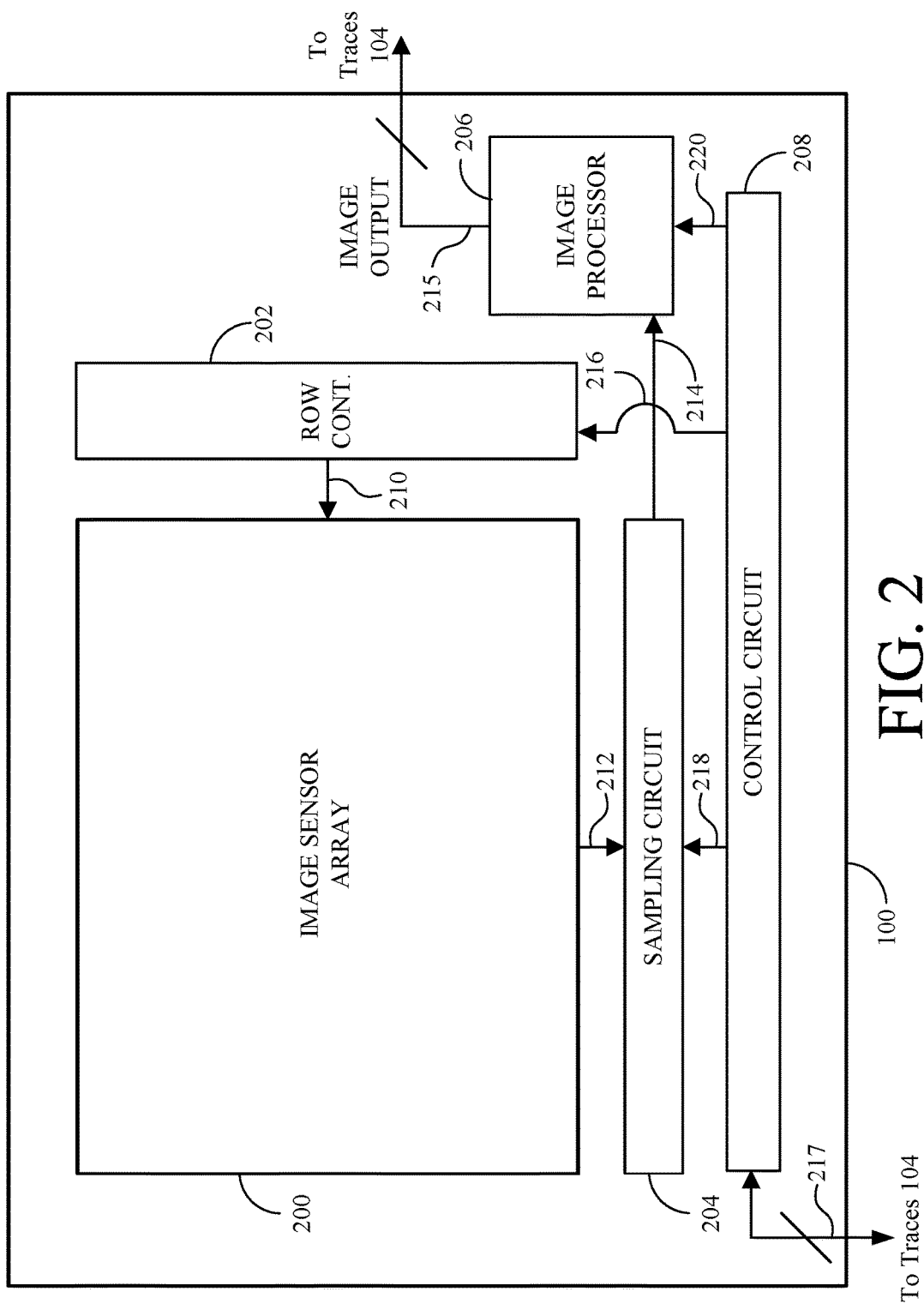
FIG. 2 is a block diagram of the camera module of FIG. 1.

FIG. 2 is a block diagram showing image sensor 100 in greater detail to include an image sensor array 200, a row controller 202, a sampling circuit 204, an image processor 206, and a control circuit 208. Image sensor array 200 is an array of large polychromatic and small color (i.e. sensitive to narrower bands of the visible light spectrum) image sensor pixels, arranged in rows and columns. The large polychromatic image sensor pixels are sensitive to a majority of the visible light spectrum (e.g., white light). The small color image sensor pixels are sensitive to narrower bands (e.g., particular colors, red, green, blue, etc.) of the visible light spectrum.

Row controller 202 provides row control signals to image sensor array 200, via a row bus 210, one at a time. When a row is selected, each pixel in that row outputs information indicative of the intensity of light that has impinged on that pixel during a shutter period to sampling circuit 204, via a data bus 212. Sampling circuit 204 captures and transfers each row of image data to image processor 206, via a data bus 214, for further processing. In order to capture a complete image, every row of image sensor array 200 is individually selected and read from.

Image processor 206 is operative to convert the digital data acquired by sampling circuit 204 into readable image data, using known image processing techniques in combination with processes specifically adapted for the unique pixel scheme of the present invention. Image processor 206 outputs the processed image data to the camera host device, via data lines 215 and traces 104 (FIG. 1), to the camera host device.

Control circuit 208 provides coordination and control of the function of each component of image sensor 100. Control circuit 208 receives control signals (e.g., instructions to capture one or more images) from the camera hosting device, via an interface bus 217 coupled to one or more of traces 104, and generates internal control instructions based at least in part on the control instructions from the host device. For example, control circuit 208 asserts control signals (e.g., a series of row addresses) onto control lines 216, causing row controller 202 to process the rows associated with each of the asserted row addresses. Control circuit 208 also asserts control signals onto control lines 218, causing sampling circuit 204 to read sensor data being asserted on data lines 212 by a selected row of image sensor array 200. After a row of image data is sampled, control circuit 208 asserts additional signals on control lines 218, causing sampling circuit 204 to transfer the sampled image data to image processor 206. Control circuit 208 also provides control signals, via a control bus 220, to image processor 206, which cause image processor 206 to read the image data from sample circuit 204 and to output the processed image data to the camera host device at appropriate times.

Figure 3:
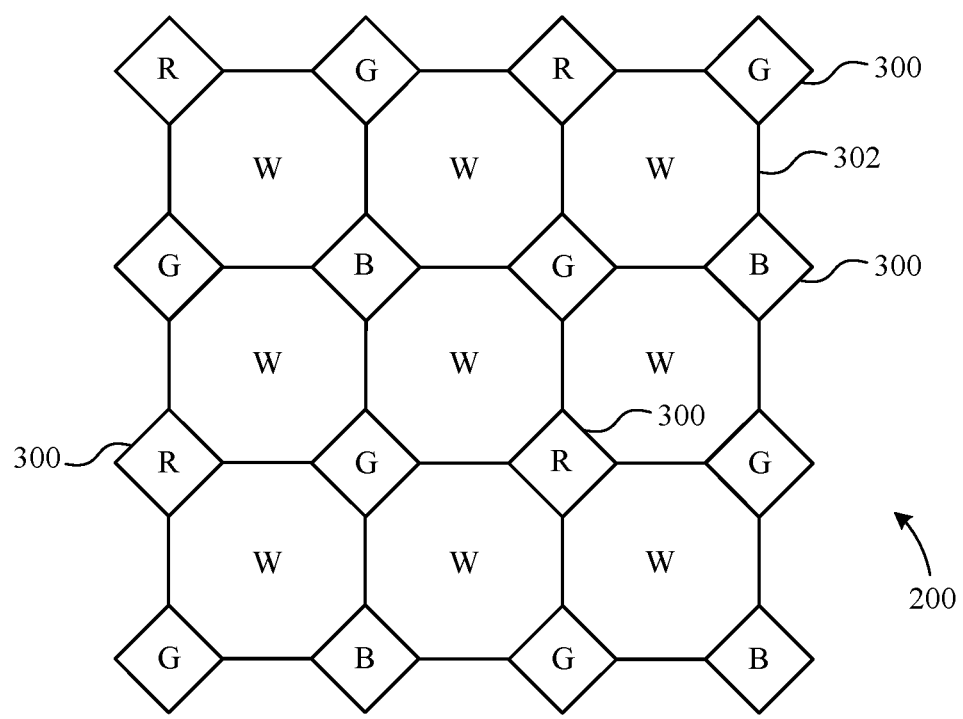
FIG. 3 shows an example pixel layout for the image sensor of FIG. 1.

FIG. 3 shows the layout of sensor pixels of a representative portion of image sensor array 200, including a plurality of color sensor pixels 300 and a plurality of white sensor pixels 302. Color sensor pixels 300 (R, G, and B) and white sensor pixels 302 (W) are arranged in rows and columns, with a row of color sensor pixels 300 between each row of white sensor pixels 302 and a column of color pixels 300 between each column of white sensor pixels 302. Color sensor pixels 300 are light sensing pixels, each with a particular color filter disposed above it. In the example embodiment, color sensor pixels 300 are one of red (R), green (G), or blue (B) sensitive pixels, arranged in a Bayer array, in which 25% of the pixels are red, 25% are blue, and 50% are green. The red and blue light sensitive pixels alternate along every other diagonal of the array, and the green light sensitive pixels are disposed along the remaining diagonals. Every other row of sensor array 200 includes either red and green pixels arranged in an alternating pattern, or green and blue pixels arranged in an alternating pattern. Similarly, every other column of sensor array 200 includes either red and green pixels arranged in an alternating pattern, or green and blue pixels arranged in an alternating pattern. In alternate embodiments color sensor pixels 300 can be sensitive to a greater or fewer number of colors, or to other different colors.

White sensor pixels 302 are larger than color sensor pixels 300 and, therefore, are more sensitive to light. Interspersing larger white sensor pixels 302 with smaller color sensor pixels 300 improves the low-light capability and the dynamic range of image sensor 100. Because they are more sensitive, white sensor pixels 302 provide better image quality in dark areas of an image or in low light situations, while color sensor pixels 300 provide better image quality in bright areas of the image or bright light situations. In addition, combining the large white pixels 302 with the smaller color pixels 300 reduces the prevalence of undesirable artifacts, such as blooming, wherein saturated pixels bleed charge to surrounding pixels resulting in a glare on the image.

The shapes and orientations of the sensor pixels are configured to use as much surface of the sensor array as possible and maintain a column and row structure. The column and row structure facilitates reading rows of captured intensity data from the array via data lines 212. Each white sensor pixel 302 is an irregular octagon formed by truncating the corners of a square. Each color sensor pixel 300 is square, but rotated by 45 degrees with respect to the truncated square shape of white sensor pixels 302. Each color sensor pixel 300 is disposed between the truncated corners of 4 adjacent white sensor pixels 302. Color sensor pixels 300 and white sensor pixels 302 can also be arranged in other patterns that can fill the sensor surface plane.

Sensor array 200 includes alternating rows and columns of color sensor pixels 300 and white sensor pixels 302. The pitch of the rows and columns of color sensors 300 is the same as the pitch between the rows and columns of white sensor pixels 302. Each color sensor pixel 300 has a center that is located between adjacent rows and columns of white sensor pixels 302.

The relative sizes of white sensor pixels 302 and color sensor pixels 300 can be altered to improve performance even more for certain applications. For example, further increasing the size of white sensor pixels 302 provides even greater sensitivity, resulting in even better low light capability. However, when using larger white sensor pixels 302 the resolution is diminished. The manufacturer of an image sensor array can optimize the performance of the array for particular applications by adjusting the relative sizes of color sensor pixels 300 and white sensor pixels 302. For example, a security camera might have to work well at night, without producing high resolution images. In this case a manufacturer would utilize white sensor pixels 302 that are significantly larger than color sensor pixels 300. In the example embodiment, the distance between adjacent color sensor pixels 300 is greater than the width of a color sensor pixel 300. In other words, the white pixels 302 are at least twice as wide and/or at least twice as long as the color sensor pixels 300.

Figure 4:
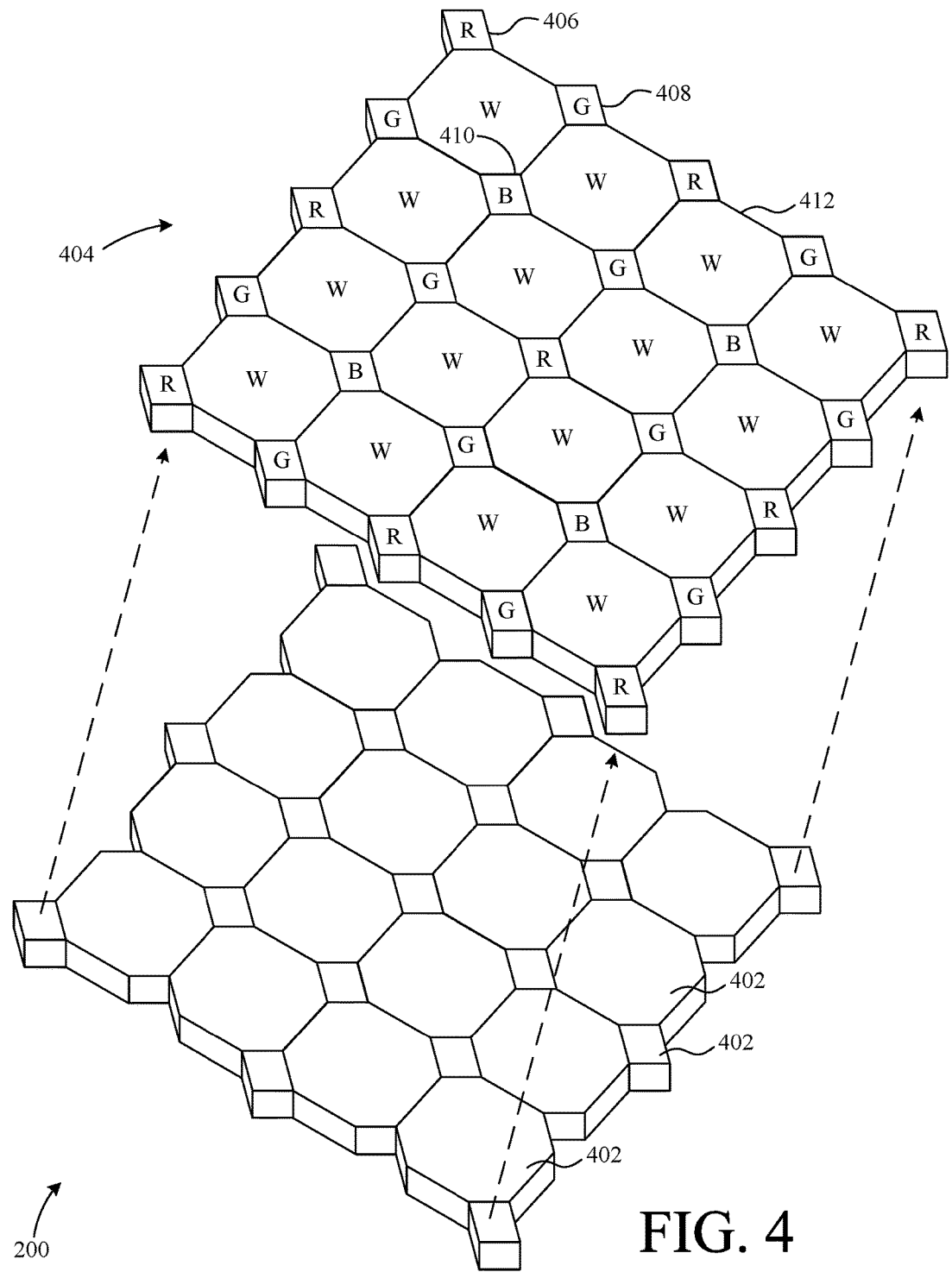
FIG. 4 is an exploded view of a portion of the image sensor array of FIG. 2.

FIG. 4 shows an exploded portion of image sensor array 200. Light sensors 402 are disposed below a light filter array 404, which includes a plurality of red filters 406, green filters 408, and blue filters 410, and white filters 412, arranged as shown. Light filter array 400 is formed above the electronic architecture of light sensor pixels 402, and each filter corresponds to an underlying light sensor 402. Each of filters 406, 408, and 410 transmit only light of certain wavelengths, which correspond to the "color" of the light to be measured by light sensors below, and can be made using various organic dyes embedded in a carrier medium. White filters 412 include a window that is transparent to a majority of the visible light spectrum, including the wavelengths associated with red filters 406, green filters 408, and blue filters 410. The window can include a transparent medium or even an open space.

Figure 5:
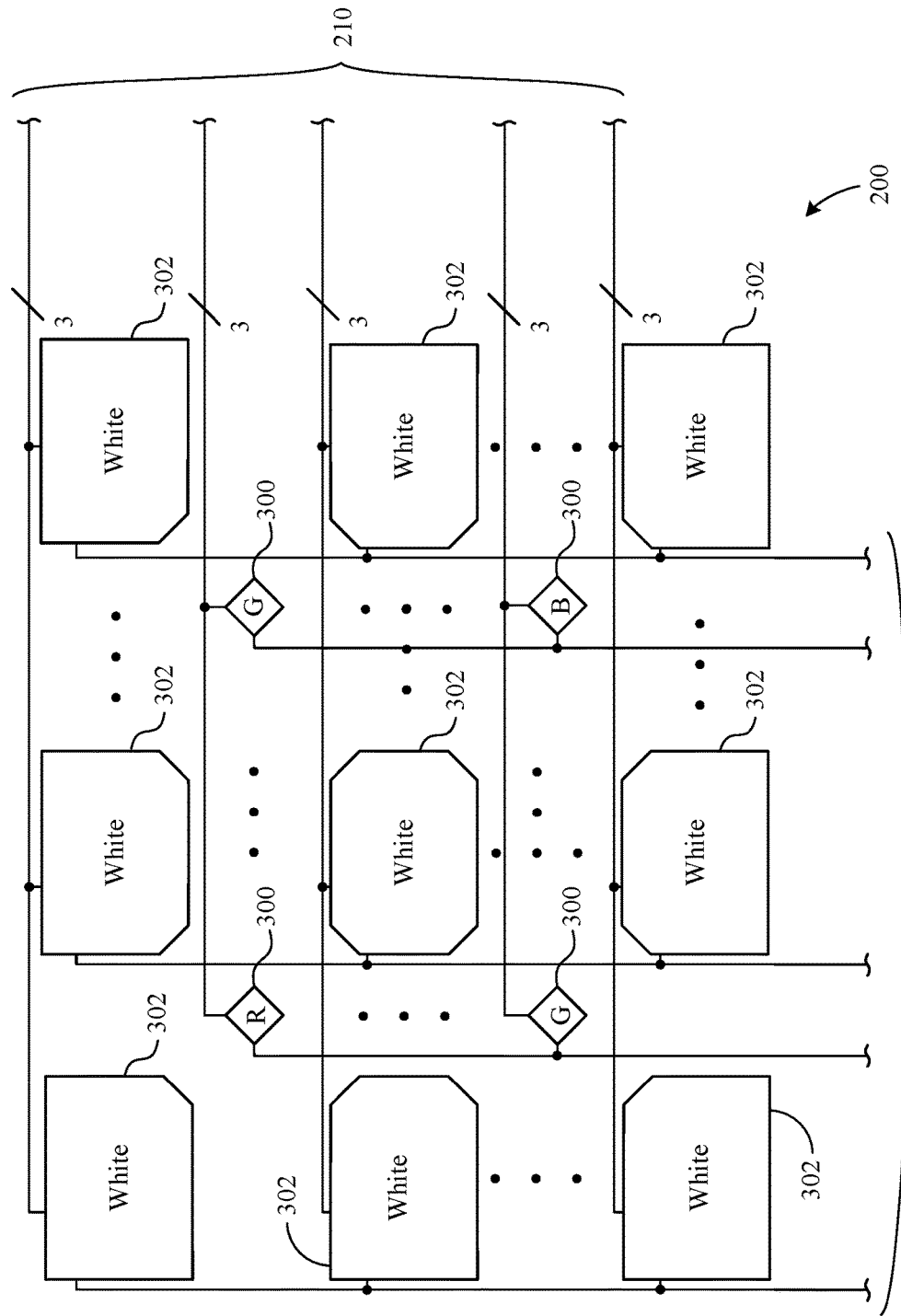
FIG. 5 is a diagram of the circuitry of the image sensor array of FIG. 2.

FIG. 5 is a schematic drawing of image sensor array 200. Each of color sensor pixels 300 and white sensor pixels 302 is electrically coupled to row control lines 210 and data lines 212. When row controller 202 (FIG. 2) asserts a row select signal on one of row control lines 210, each pixel in the associated row asserts a signal corresponding to a detected light intensity on an associated one of data lines 212. Sampling circuit 204 (FIG. 2) then latches the row of data values being asserted on data lines 212 by the selected row, thus capturing a line of image data. The process continues for each row until data indicative of an entire image has been sent to sampling circuit 204.

FIG. 5 is not drawn to scale. For example, significant space is shown between neighboring pixels, to facilitate a clear view of row control lines 210 and data lines 212. In actual embodiments, sensor pixels 300 and 302 are as close together as possible, to maximize the sensitive area of sensor array 200.

Figure 6:
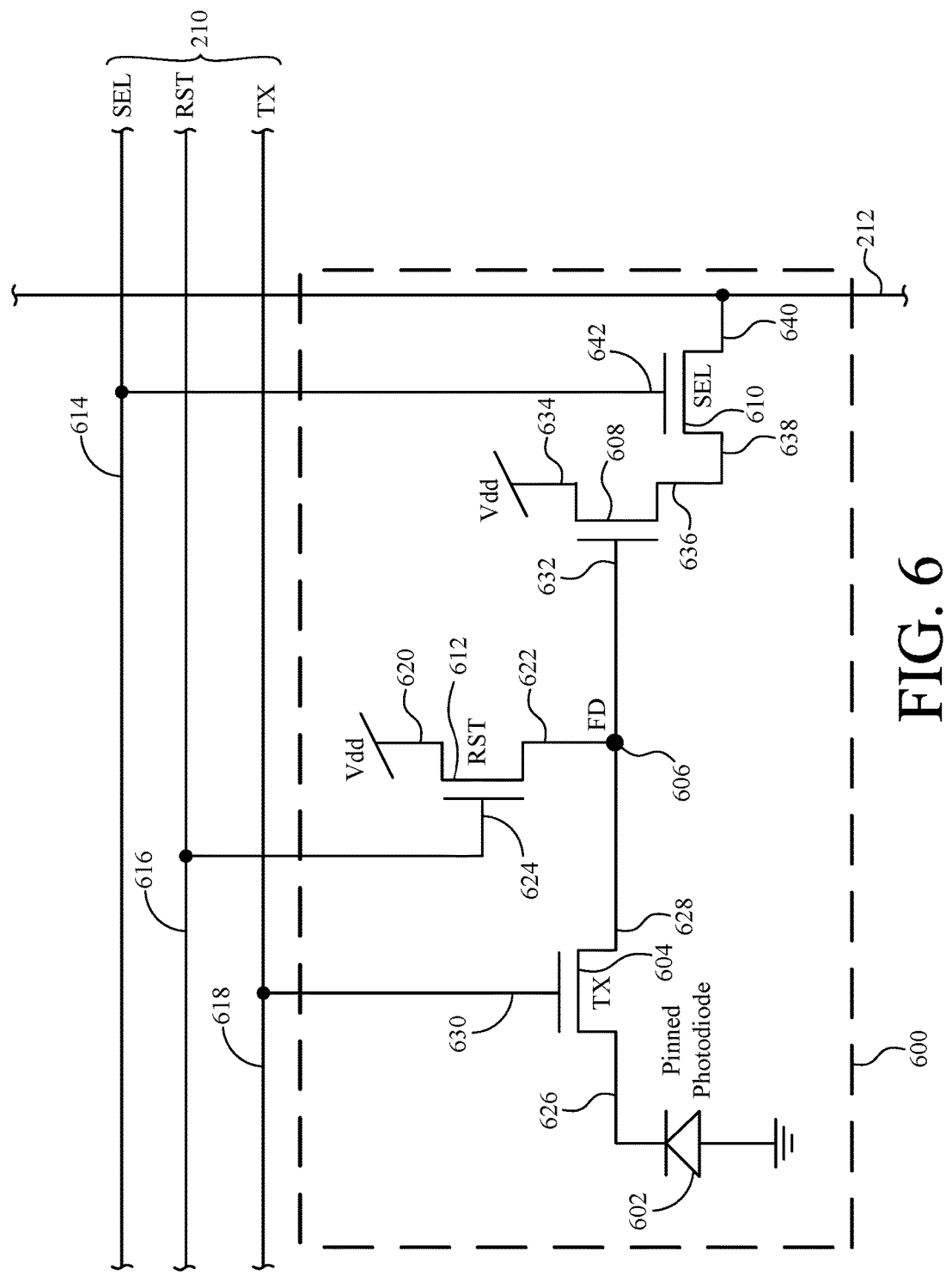
FIG. 6 is a diagram of the circuitry of a pixel of the image sensor array of FIG. 2.

FIG. 6 is a circuit diagram of an individual image sensor pixel 600 (e.g., one of color sensing pixels 300 or white sensor pixels 302). In the example embodiment, sensor pixel 600 is a four-transistor (4T) pixel, including a photodiode 602, a transfer gate 604, a floating diffusion region 606, a source follower 608, a select gate 610, and a reset gate 612. Row control lines 210 are shown to include a select line (SEL) 614, a reset line (RST) 616, and a transfer line (TX) 618.

Reset gate 612 includes a first terminal 620 electrically coupled supply voltage Vdd, a second terminal 622 electrically coupled to floating diffusion region 606, and a gate 624 electrically coupled to reset line 616. When row controller 202 asserts a reset signal (e.g. a digital high) on reset line 616, transistor 612 is temporarily placed into a conducting state wherein floating diffusion region 606 is coupled to voltage source Vdd. As a result, the previous charge state of floating diffusion region 606 is returned to a known reference charge state. Then, when row controller 202 asserts a low voltage on reset line 616, reset transistor 612 returns to a non-conducting state, whereby floating diffusion region 606 is electrically isolated from voltage source Vdd.

When light impinges on photodiode 602, negative charge carriers build up. The amount of charge carriers that build up is based on the intensity of the light impinging on photodiode 602 and the length of time that the light is impinging.

Transfer gate 604 (a gate transistor) includes a first terminal 626, which is electrically coupled to photodiode 602, a second terminal 628, which is electrically coupled to floating diffusion region 606, and a gate terminal 630 which is electrically coupled to transfer line 618. After a shutter period, row controller 202 asserts a signal on transfer line 618 and, therefore, on gate terminal 630, which places transfer gate 604 in a conducting state, allowing the accumulated charge to move from photodiode 602 to floating diffusion region 606. The charge transfer pulls the voltage on floating diffusion 606 down from its reset voltage (Vdd) by an amount depending on the accumulated transferred charge.

Source follower 608 includes a gate terminal 632, which is electrically coupled to floating diffusion 606, a second terminal 634, which is electrically coupled to a voltage source Vdd, and a third terminal 636, which is electrically coupled select gate 610. The voltage on third terminal 636 depends on the conductive state of source follower 608, which depends on the voltage on gate terminal 632. Therefore, the voltage on third terminal 636 will be a known function of the voltage on floating diffusion region 606, which depends on the charge transferred from the photodiode 602. The voltage on the third terminal 636, therefore, represents the intensity value generated by the pixel sensor 600.

Select gate 610 includes first terminal 638, which is electrically coupled to third terminal 636, a second terminal 640, which is electrically coupled to one of data control lines 212, and a gate terminal 642, which is coupled to select line 614. When a signal is asserted onto select line 614, that signal is conveyed to gate terminal 642 select gate 610, placing select gate 610 into a conductive state, thereby communicating the voltage on third terminal 636 of source follower 608 to data line 212. This voltage is latched by sampling circuit 204 (FIG. 2) and is indicative of the intensity of light that impinged on photodiode 602 during the shutter period.

Figure 7:
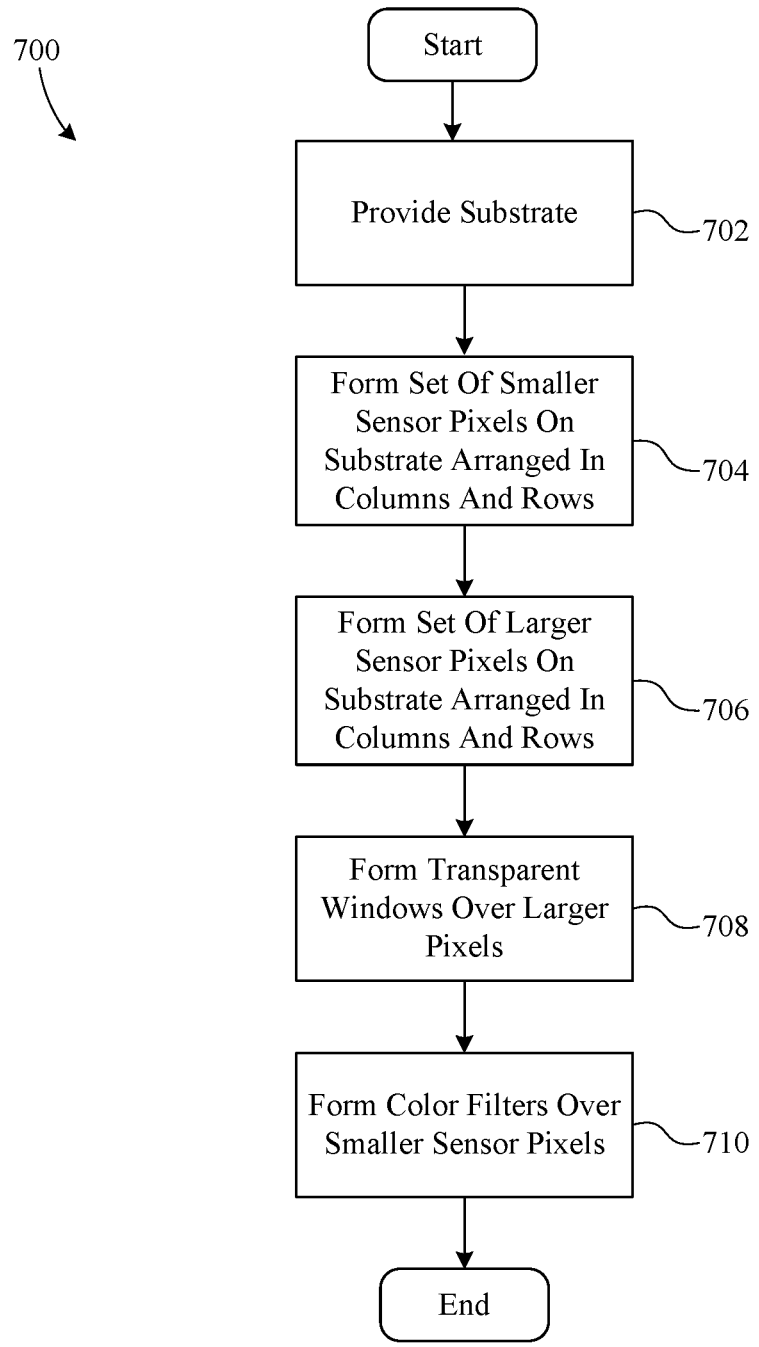
FIG. 7 is a flow chart summarizing an example method of manufacturing an image sensor.

FIG. 7 is a flow chart summarizing an example method 700 of manufacturing an image sensor. In a first step 702, a substrate is provided. Then, in a second step 704, a set of smaller sensor pixels arranged in columns and rows is formed on the substrate. Next, in a third step 706, a set of larger sensor pixels arranged in columns and rows is formed on the substrate. Then, in a fourth step 708, a set of transparent windows is formed over the larger pixels, and, in a fifth step 710, a set of color filters is formed over the smaller sensor pixels.

The description of particular embodiments of the present invention is now complete. Many of the described features may be substituted, altered or omitted without departing from the scope of the invention. For example, alternate pixel shapes may be substituted for the specific shapes shown. As another example, alternate sensor circuitry (e.g., three-transistor sensor) can be substituted for the four-transistor circuit described. These and other deviations from the particular embodiments shown will be apparent to those skilled in the art, particularly in view of the foregoing disclosure.

We claim:

1. A method of manufacturing an image sensor, comprising: providing a substrate;
   forming a first set of sensor pixels on said substrate arranged in rows and columns;
   forming a second set of sensor pixels on said substrate arranged in rows and columns, each pixel of said second set of pixels being smaller than each pixel of said first set of pixels;
   forming a set of transparent windows over said first set of sensor pixels, said transparent windows being arranged in rows and columns and each being configured to pass light within a first range of wavelengths; and
   forming a set of filters over said second set of sensor pixels, said filters being arranged in rows and columns and each being configured to pass light within one of a set of ranges of wavelengths, each range of wavelengths of said set of ranges of wavelengths being a subrange of said first range of wavelengths;
   wherein each pixel of said first set of pixels has a center disposed between adjacent rows of said second set of pixels and between adjacent columns of said second set of pixels; and
   wherein said step of forming a second set of sensor pixels includes forming each pixel of said second set of sensor pixels spaced apart from every other pixel of said second set of sensor pixels by a distance greater than a width of one of said sensor pixels of said second set of sensor pixels.

2. The method of claim 1, wherein said set of ranges of wavelengths includes a second range of wavelengths, a third range of wavelengths, and a fourth range of wavelengths.

3. The method of claim 2, wherein:
   said second range of wavelengths corresponds to a red portion of the visible light spectrum;
   said third range of wavelengths corresponds to a green portion of the visible light spectrum; and
   said fourth range of wavelengths corresponds to a blue portion of the visible light spectrum.

4. The method of claim 3, wherein said step of forming a set of filters over said second set of sensor pixels includes:
   forming a first group of filters configured to pass only light within said second range of wavelengths, said first group of filters comprising 25% of said second set of filters;
   forming a second group of filters configured to pass only light within said third range of wavelengths, said second group of filters comprising 50% of said second set of filters; and
   forming a third group of filters configured to pass only light within said fourth range of wavelengths, said third group of filters comprising 25% of said second set of filters.

5. The method of claim 4, wherein said step of forming a set of filters includes:
   forming one half of said rows of said set filters with filters of said first group and with filters of said second group arranged in an alternating pattern; and
   forming the other half of said rows of said set of filters with filters of said second group and with filters of said third group arranged in an alternating pattern.

6. The method of claim 5, wherein said step of forming a set of filters includes:
   forming half of said columns of said set of filters with filters of said first group and with filters of said second group arranged in an alternating pattern; and
   forming the other half of said columns of said set of filters with filters of said second group and with filters of said third group arranged in an alternating pattern.

7. The method of claim 1, wherein said step of forming a second set of sensor pixels includes forming each pixel of said second set of sensor pixels between each group of 4 adjacent pixels of said first set of sensor pixels.

8. The method of claim 7, wherein said step of forming a set of filters includes forming each filter of said set of filters between each group of 4 adjacent transparent windows of said set of transparent windows.

9. The method of claim 8, wherein said step of forming a second set of sensor pixels includes forming each pixel of said second set of sensor pixels between truncated corners of 4 adjacent pixels of said first set of sensor pixels.

10. The method of claim 9, wherein said step of forming a set of filters includes forming each filter of said set of filters between truncated corners of 4 adjacent transparent windows of said set of transparent windows.

11. The method of claim 1, wherein said step of forming a set of filters includes forming each filter of said set of filters spaced apart from every other filter of said set of filters by a distance greater than a width of one of said filters.

12. The method of claim 1, wherein said steps of forming a first set of sensor pixels and forming a second set of sensor pixels include:
    forming one fewer rows of said sensor pixels of said second set than said sensor pixels of said first set; and
    forming one fewer columns of said sensor pixels of said second than said sensor pixels of said first set.

13. The method of claim 12, wherein said steps of forming a set of transparent windows and forming a set of filters include:
    forming one fewer rows of said filters than said transparent windows; and
    forming one fewer columns of said filters than said transparent windows.

14. The method of claim 1, further comprising forming a set of micro-lenses above said set of transparent windows and said set of filters, said set of micro-lenses being configured to increase the effective area of each pixel of said first set and said second set of sensor pixels.

15. The method of claim 1, wherein said step of forming a second set of sensor pixels includes forming said second set of sensor pixels with a pitch between adjacent rows of said second set of sensor pixels that is equal to a pitch between adjacent rows of said first set of sensor pixels.

16. The method of claim 15, wherein said step of forming a second set of sensor pixels includes forming said second set of sensor pixels with a pitch between adjacent columns of said second set of sensor pixels that is equal to a pitch between adjacent columns of said first set of sensor pixels.

17. The method of claim 16, wherein said step of forming a set of filters includes forming said set of filters with a pitch between adjacent rows of said set of filters that is equal to a pitch between adjacent rows of said set of transparent windows.

18. The method of claim 17, wherein said step of forming a set of filters includes forming said set of filters with a pitch between adjacent columns of said set of filters that is equal to a pitch between adjacent rows of said set of transparent windows.

19. A method for manufacturing a camera module, comprising:
   providing a housing defining an aperture;
   disposing a lens in said aperture; and
   fixing an image sensor within said housing; and
   wherein said image sensor is disposed in a focal plane of said lens;
   said image sensor includes a plurality of image sensor pixels including a first set arranged in rows and columns and a second set arranged in rows and columns, each pixel of said first set configured to detect light of the entire visible spectrum and each pixel of said second set operative to detect light of one of three distinct colors, each pixel of said first set being larger than each pixel of said second set;
   each of said first set of pixels has a center disposed between adjacent rows of said second set of pixels and between adjacent columns of said second set of pixels; and
   wherein said step of forming a second set of sensor pixels includes forming each pixel of said second set of sensor pixels spaced apart from every other pixel of said second set of sensor pixels by a distance greater than a width of one of said sensor pixels of said second set of sensor pixels.

* * * * *